United States Patent
Cao

(10) Patent No.: US 7,948,312 B2
(45) Date of Patent: May 24, 2011

(54) MULTI-BIT CLASS-D POWER AMPLIFIER SYSTEM

(75) Inventor: Zhiheng Cao, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 12/465,550

(22) Filed: May 13, 2009

(65) Prior Publication Data

US 2010/0289578 A1 Nov. 18, 2010

(51) Int. Cl.
*H03F 3/217* (2006.01)
(52) U.S. Cl. ............... 330/251; 330/207 A; 330/305
(58) Field of Classification Search ............... 330/10, 330/251, 207 A, 302, 305
See application file for complete search history.

(56) References Cited

U.S. PATENT DOCUMENTS

| | | | |
|---|---|---|---|
| 3,480,881 A | 11/1969 | Boykin | |
| 6,002,256 A * | 12/1999 | Slade | 324/322 |
| 7,705,674 B2 * | 4/2010 | McMorrow | 330/251 |
| 2005/0088231 A1 | 4/2005 | Ziegler | |
| 2007/0052475 A1 | 3/2007 | Smiley | |
| 2009/0154544 A1 * | 6/2009 | Potscher et al. | 375/238 |

FOREIGN PATENT DOCUMENTS

| | | |
|---|---|---|
| EP | 1909389 A2 | 4/2008 |
| WO | WO2009001233 A1 | 12/2008 |
| WO | WO2009016036 A1 | 2/2009 |

OTHER PUBLICATIONS

Stauth, J.T.; Sanders, S.R.; "A 2.4GHz, 20dBm class-D PA with single-bit digital polar modulation in 90nm CMOS", Custom Integrated Circuits Conference, 2008. CICC 2008. IEEE; Sep. 21-24, 2008 pp. 737-740.
van Zeijl, P.T.M.; Collados, M.; "A Digital Envelope Modulator for a WLAN OFDM Polar Transmitter in 90 nm CMOS", Solid-State Circuits, IEEE Journal of; vol. 42, Issue 10, Oct. 2007 pp. 2204-2211.
Kavousian, A.; Su, D.K.; Wooley, B.A.; "A Digitally Modulated Polar CMOS PA with 20MHz Signal BW", Solid-State Circuits Conference, 2007. ISSCC 2007. Digest of Technical Papers. IEEE International; Feb. 11-15, 2007 pp. 78-588.
Hung, et al., "Design of H-Bridge Class-D Power Amplifiers for Digital Pulse Modulation Transmitters" IEEE Transactions on Microwave Theory and Techniques, vol. 55, No. 12, Dec. 2007, pp. 2845-2855.
International Search Report and Written Opinion - PCT/US2010/034792, International Search Authority - European Patent Office - Jul. 12, 2010.

* cited by examiner

*Primary Examiner* — Hieu P Nguyen
(74) *Attorney, Agent, or Firm* — Ramin Mobarhan

(57) ABSTRACT

Techniques for designing an efficient power amplifier are described. In one aspect, multiple single unit instance class-D power amplifiers with coupled outputs are utilized to increase efficiency and reduce quantization noise. In another aspect, multiple groups of single unit instance class-D power amplifiers are coupled at the outputs thereof with each group of power amplifiers configured to resonate at unique frequency. This results in increased efficiency and reduction of quantization noise at multiple frequencies bands.

27 Claims, 7 Drawing Sheets

Case #1 Combining Two In-Phase Signal

Case #2 One Turns OFF
Power Delivered: -6dB
Ron Power Loss: -6dB

MULTI-BIT CLASS-D POWER AMPLIFIER SYSTEM

TECHNICAL FIELD

The present disclosure relates generally to electronics, and more specifically to class-D power amplifiers.

BACKGROUND

In communication devices, such as Code Division Multiple Access (CDMA), Long Term Evolution (LTE), Worldwide Interoperability for Microwave Access (WiMax), Wireless Local Area Network (WLAN) and Bluetooth or other Personal Area Networks (PAN) communication devices, the ability to amplify signals with a high peak-to-average ratio (PAR) is necessary to allow the transmission of the desired signal from a transmitter to a receiver device.

Communication devices may include a power amplifier (PA) to amplify the desired transmit signal to an energy level sufficient to allow propagation of the transmit signal to a desired receiver location. While ideal amplifiers provide constant gain for all input signals, known as linear operation, real amplifiers only perform linearly within certain practical limits. For example, in an ideal amplifier when the input signal applied to the amplifier is increased, the output resulting signal also increases by the same amount. However, in a real amplifier there is a point where the amplifier becomes saturated and cannot produce any more output power. This is known as clipping and results in distortion of the amplified output signal. Some amplifiers are designed to gradually reduce the gain as saturation is reached, thus resulting less excessive distortion of the output signal. This is known as amplifier compression. Either form of distortion will have a negative effect on the communication link between the transmitter and the receiver in the form of increased error rates.

Therefore, there is a need for a power amplifier which provides linear amplification of the desired high PAR transmit signal.

Another important aspect of a power amplifier is efficiency. Efficiency is the measure of how much of the input power is usefully applied to the amplifier's output. For example, class A amplifiers are very inefficient providing only 10-25% power efficiency. Class B amplifiers are much more efficient but suffer from high levels of crossover distortion. Class AB amplifiers can be used to avoid crossover distortion, but have relatively low efficiency varying from 35-78.5%. Class D amplifiers, also known as switching amplifiers, have efficiency as high as 97% and do not suffer from crossover distortion. An increase in amplifier efficiency results in a decrease in power consumption and heat generation. Therefore, in mobile communication devices where power is limited and heat dissipation is difficult, high efficiency amplifiers are highly desirable.

Non switching power amplifiers such as class-A or AB face inevitable trade-off between linearity and power efficiency. More often than not, efficiency must be sacrificed to meet adjacent channel leakage specification. In addition, because efficiency drops sharply at power back-off, the average efficiency when delivering high PAR signals is much less than peak efficiency. For example, for an ideal class-A power amplifier with 50% peak efficiency, efficiency is merely 7.4% for a clipped 802.11g signal with PAR of 8.3 dB.

Polar modulation is a popular choice to achieve better power efficiency than with a linear power amplifier. However, because amplifier delay is a function of supply voltage, AM-PM distortion compensation is usually necessary. The availability of fast PMOS transistors in advanced CMOS processes enabled class-D power amplifiers with delta-sigma modulated digital input to be used for RF applications. In contrast with linear power amplifiers, this type of power amplifier achieves high power efficiency and linearity simultaneously. Compared with a class-E amplifier, where a transistor drain has to sustain ~3.5 times VDD of voltage swing, a class-D power amplifier does not have oxide issues and theoretically delivers the most power for a given oxide breakdown voltage.

Furthermore, because the amplitude modulation is performed in time domain, it is guaranteed to be linear and does not suffer the same AM-PM distortion of supply modulated polar power amplifier. However, the 1-bit quantization noise power must be shaped out-of-band, where they must be filtered by an external RF filter, which not only adds cost but also reduces power efficiency due to insertion loss. In the implementation described by J. T. Stauth and S. R. Sanders, "A 2.4 GHz, 20 dBm Class-D PA with Single-Bit Digital Polar Modulation in 90 nm CMOS," *IEEE Custom Integrated Circuits Conference*, September 2008, even after the filter, out-of-band noise floor is still 30~40 dB higher than a typical co-existence specification of WLAN and Bluetooth to enable simultaneous cellular/GPS receive operation.

FIG. 6 and FIG. 7 show a schematic diagram of two different conventional modulation schemes. FIG. 6 is a conventional digital envelope modulator for a WLAN OFDM polar transmitter described by P. van Zeijl in "*A Digital Envelope modulator for WLAN OFDM Polar Transmitter in 90 nm CMOS*" JSSC October, 2007. FIG. 7 is a conventional digitally modulated polar CMOS power amplifier described by A. Kavousian in "*A Digitally Modulated Polar CMOS PA with 20 MHz Signal BW*" ISSC, 2007. Both of these conventional schemes are essentially the same in that they both modulate amplitude with attenuation by resistance, therefore smaller amplitudes result in larger percentages of power loss. The resulting increase in power loss for smaller amplitudes results in sub-optimum power efficiency performance.

Suppression of quantization noise is another important aspect of a power amplifier. Quantization noise is the result of quantization error introduced by quantization in the analog-to-digital (ADC) process. Quantization error is the error between the analog input voltage to the ADC and the output digitized value. When the quantization error is modulated within the transmitter, quantization noise is created which results in out of band noise being amplified and transmitted. Out of band transmissions are undesirable because they may cause interference with other communication systems utilizing the out of band frequencies.

Therefore, there is also need for a power amplifier capable of reducing quantization noise.

BRIEF DESCRIPTION OF THE DRAWINGS

FIG. 4A is an exemplary embodiment showing two single unit instance class-D power amplifiers coupled in a parallel configuration operating with both amplifier input signals ON and in-phase.

FIG. 4B is an exemplary embodiment showing two single unit instance class-D power amplifiers coupled in parallel configuration with a first amplifier input signal OFF and the second amplifier input signal ON.

DETAILED DESCRIPTION

Figure 1:
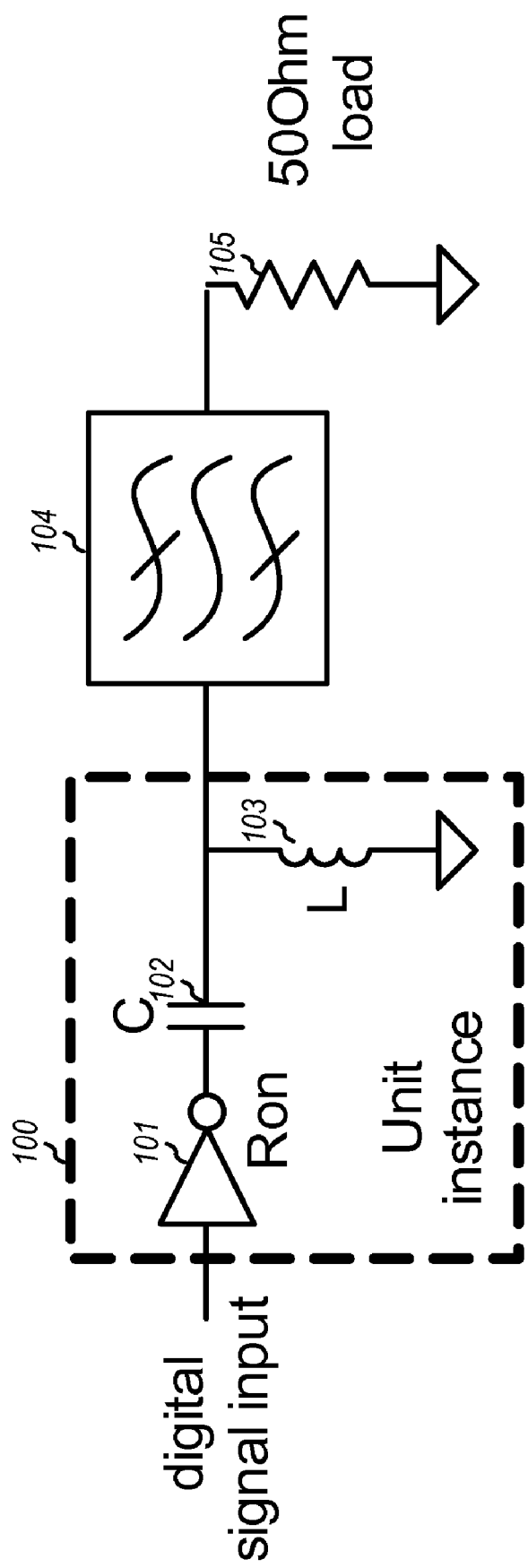
FIG. 1 is a block diagram of a bandpass filter and a resistive load shown coupled to a single unit instance class-D power amplifier of a multi-level class-D power amplifier system in accordance with an exemplary embodiment.

The word "exemplary" is used herein to mean "serving as an example, instance, or illustration." Any embodiment described herein as "exemplary" is not necessarily to be construed as preferred or advantageous over other embodiments.

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

It is well understood, for example, that class-D amplifiers operate in on/off mode and may use either pulse width modulation (PWM) or pulse density modulation (PDM) schemes. The input signal is converted to a sequence of pulses whose averaged value is directly proportional to the instantaneous amplitude of the signal. The frequency of the pulses is often ten or more times greater than the frequency of interest in the input signal.

In addition, class-D amplifiers provide a large increase in power efficiency over other types of amplifier circuits. Due to the fixed amplitude of the output pulses, the switching transistors are switched either on or off, rather than operating in linear mode. This results in very little power dissipation suffered by the transistors, except during the very short interval between the on and off states.

The power loss in class-D amplifiers is low because the instantaneous power dissipated in the transistor is the product of voltage and current, and one or the other is almost always close to zero during operation. This reduction in power consumption provides decreased circuit operation temperature and reduced power consumption.

Class-D amplifiers may be controlled by either analog or digital circuits. Digital control may introduce additional distortion known as Quantization noise. Quantization noise is the result of quantization error introduced by quantization in the analog-to-digital (ADC) process. Quantization error is the error between the analog input voltage to the ADC and the output digitized value. When the quantization error is modulated within the transmitter, quantization noise is created which results in out of band noise being amplified and transmitted. Out of band transmissions are undesirable because they may cause interference with other communication systems utilizing the out of band frequencies. Passive filtering may be used to reduce this quantization noise.

Figure 4:
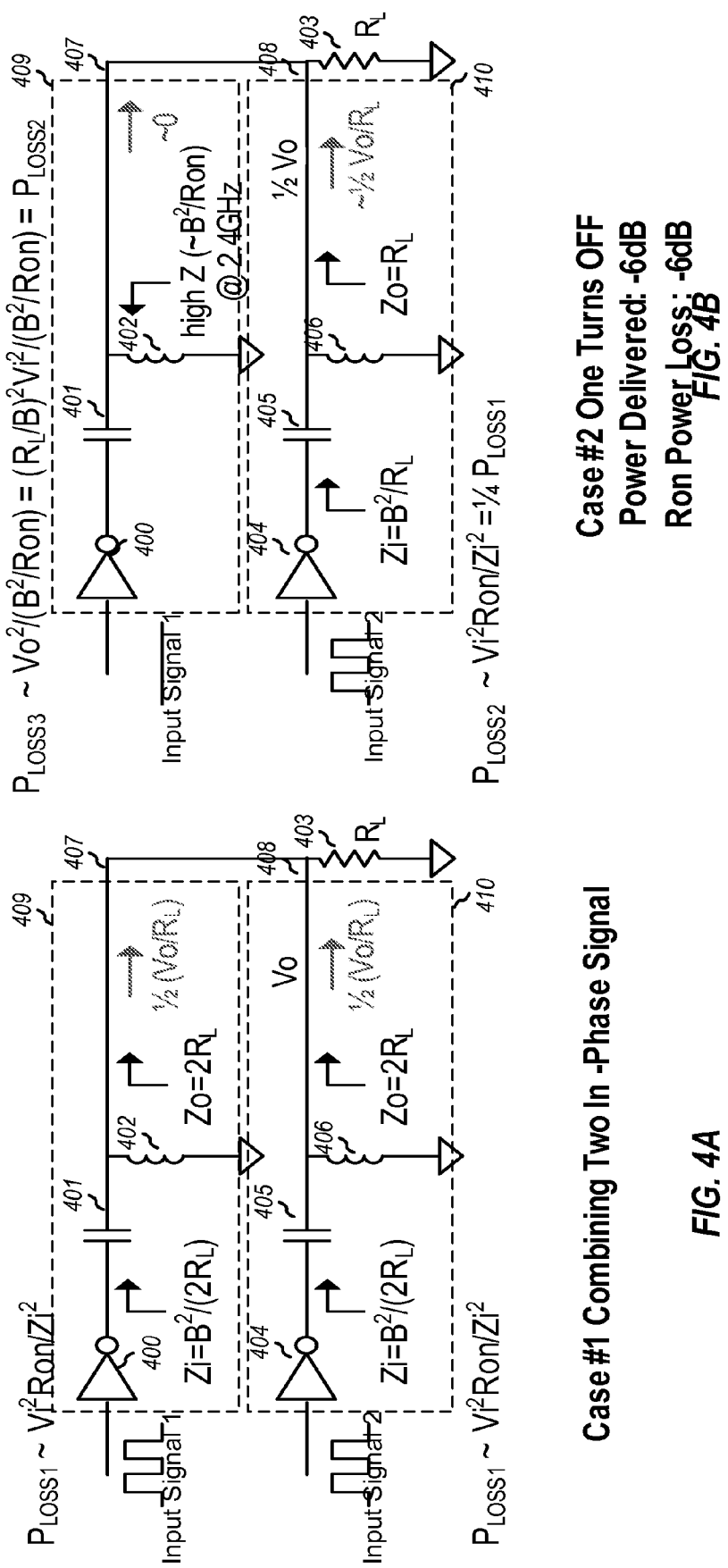

In accordance with exemplary embodiments to be described in greater detail herein, a class-D power amplifier system is provided having multiple class-D power amplifiers with respective coupled output terminals which are tuned to resonate at a desired frequency. Each such class-D power amplifier shall be commonly referred to hereinafter as a single unit instance class-D power amplifier, or more simply as a "unit instance". As shall be explained below, by combining multiple such single unit instance class-D power amplifiers in parallel, amplifier performance is improved. An example of multiply combined single unit instance class-D power amplifiers in accordance with the exemplary embodiment is shown in FIG. 4A. Here the outputs of single unit instance class-D power amplifiers 409 and 410, respectively, are coupled together and tuned to resonate at the same frequency.

FIG. 1 is a block diagram of a bandpass filter 104 and a resistive load (represented by 50 ohm resistor 105) shown coupled to a single unit instance class-D power amplifier (or "unit instance") 100 of a multi-level class-D power amplifier system in accordance with an exemplary embodiment. Single unit instance class-D power amplifier 100 includes inverter 101, capacitor 102 and inductor 103. In the exemplary embodiment shown, a PWM or PDM digital signal input is coupled to an input terminal of single unit instance class-D power amplifier 100 tuned to oscillate at a desired frequency. The input of single unit instance class-D power amplifier 100 is coupled to an input of inverter 101. The output of inverter 101 is coupled to a first terminal of capacitor 102. A second terminal of capacitor 102 is coupled to a first terminal of inductor 103. A second terminal of inductor 103 is coupled to signal ground. The first terminal of inductor 103 is also coupled to an output of single unit instance class-D power amplifier 100. The output of single unit instance class-D power amplifier 100 is coupled to an input terminal of bandpass filter 104. An output of bandpass filter 104 is coupled to a first terminal of resistor 105. A second terminal of resistor 105 is coupled to signal ground.

Figure 2:
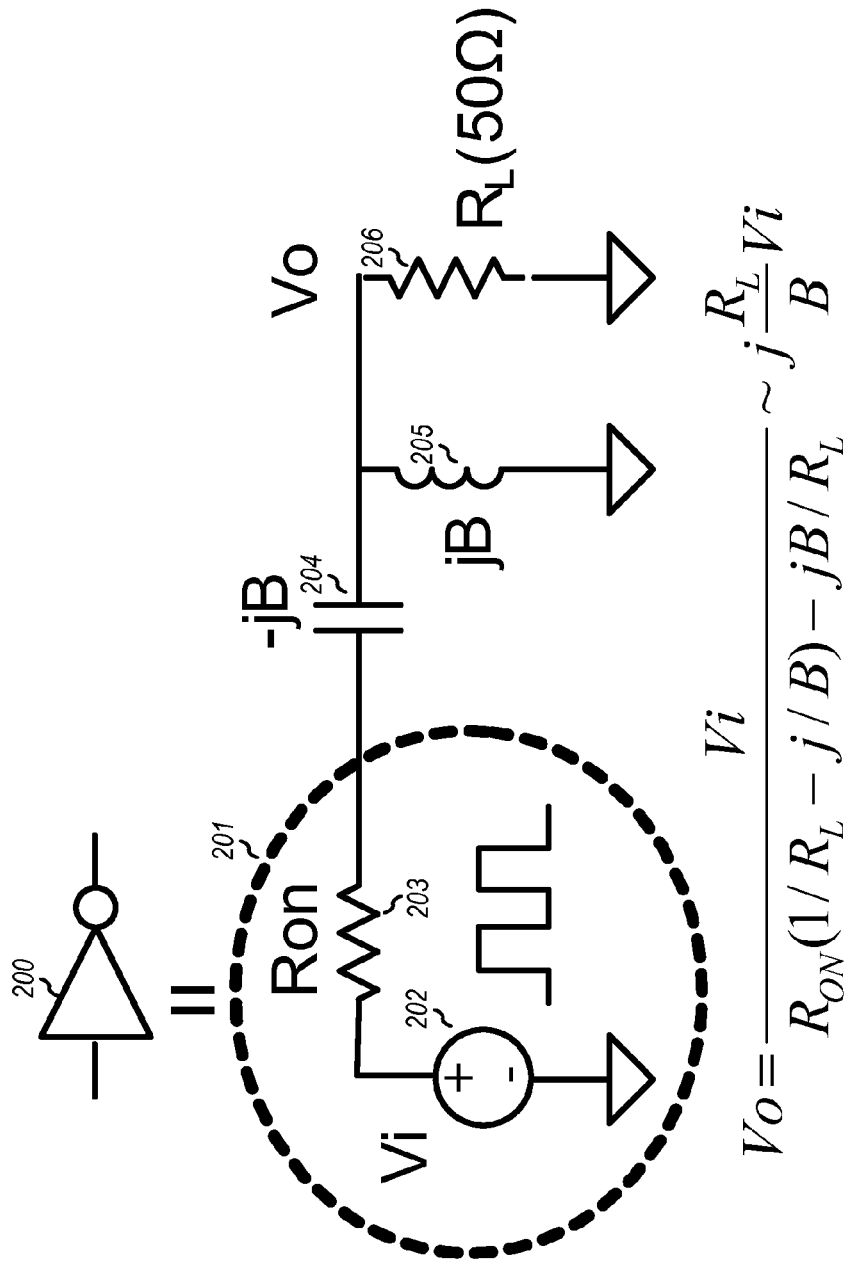
FIG. 2 shows an exemplary circuit level schematic of the block diagram of FIG. 1 in accordance with the exemplary embodiment.

FIG. 2 shows an exemplary circuit level schematic of the block diagram of FIG. 1 in accordance with the exemplary embodiment. An input voltage Vi is received at a first terminal of first resistor 203. A second terminal of first resistor 203 is coupled to a first terminal of capacitor 204. A second terminal of capacitor 204 is coupled to a first terminal of inductor 205 and a first terminal of second resistor 206. A second terminal of inductor 205 is coupled to signal ground. A second terminal of resistor 206 is coupled to signal ground. Inverter 101 shown in FIG. 1 is represented by internal voltage source 202 and first resistor 203. The LC network comprised of capacitor 204 and inductor 205 corresponds to bandpass filter 104 in FIG. 1. Similarly, resistor 206 corresponds to resistor 105 (resistance load).

The gain of the single unit instance class-D power amplifier 200 shown in FIG. 2 may be expressed as follows:

$$V_O = \frac{Vi}{R_{ON}(1/R_L - j/B) - jB/R_L} \sim -j\frac{R_L}{B}Vi \qquad \text{Eq. (1)}$$

where, Vi is the input voltage, Vo is the output voltage, Ron is the inverter on resistance value and B is equal to $1/(wC)$.

As shown in Equation 1 above, the gain of single unit instance class-D power amplifier 200 can be adjusted so that the output load voltage swing, Vo, can be several times larger than the input voltage, Vi. This large gain provides the necessary power to the output load without necessitating a large voltage swing at the amplifier input, Vi. This reduction in voltage swing at the amplifier input terminal avoids possible oxide breakdown. Oxide breakdown is the destruction of an oxide layer in a semiconductor device. Oxide breakdown can be caused by a high voltage being applied across the oxide layer, causing a dielectric breakdown, which allows current to flow between previously isolated nodes within the transistor.

Equation 1 further demonstrates linearity in gain provided by a class-D amplifier. As described above, because class-D amplifiers have inherent high efficiency performance, linearity does not need to be compromised or traded off in order to achieve high efficiency.

The output impedance of single unit instance class-D power amplifier 200 may be expressed as follows:

$$PA\ Rout = (wL)^2/Ron \qquad Eq.\ (2)$$

where, Ron is the on resistance of inverter 200 and L is the inductance of inductor 205.

As is shown above in Equation 2, the output impedance of single unit instance class-D power amplifier 200 is inversely related to the Ron impedance. The maximum power is delivered to the load occurs when the amplifier output impedance is matched to the load resistance. However, output matching results in low efficiency because in order to achieve high efficiency Ron must be set to a resistance value which is lower than the resistance value required for impedance matching. Therefore, the balance between delivered power and amplifier efficiency is controlled by adjusting the L/C ratio as well as the Ron value.

Figure 3:
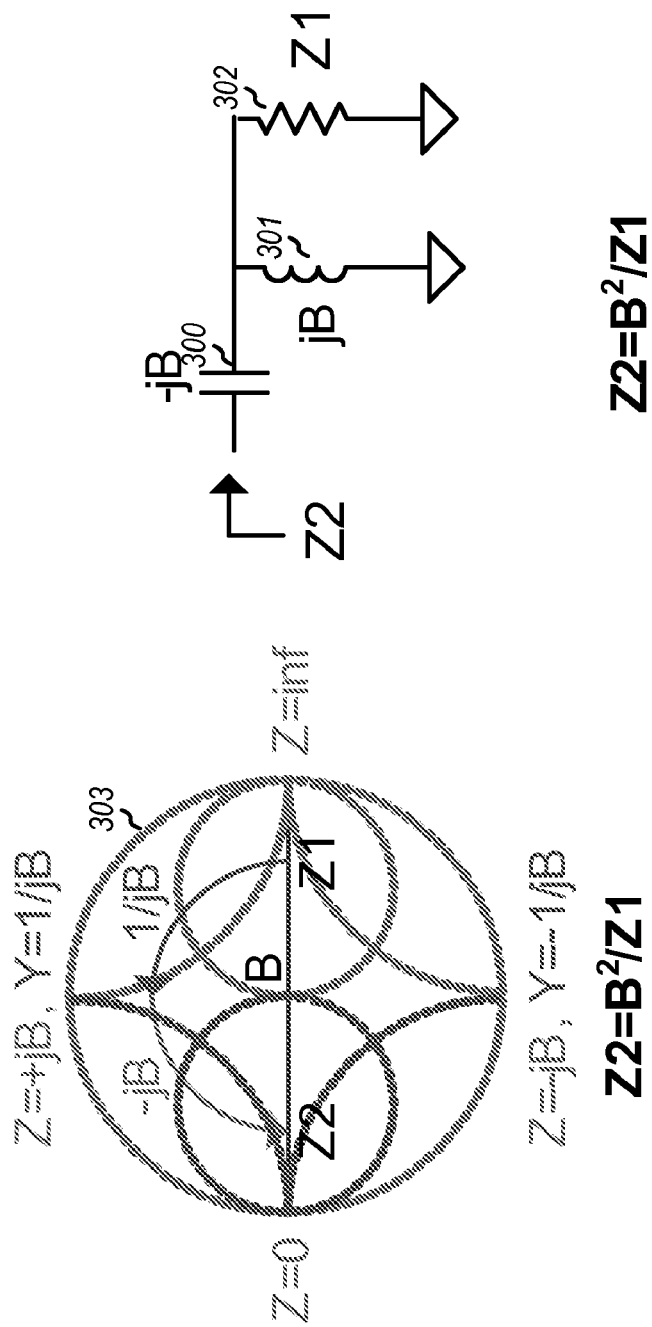
FIG. 3 shows a schematic of an inductor-capacitor (LC) network contained in the single unit instance class-D power amplifier of FIG. 1 and the corresponding Smith chart illustrating impedance inversion at resonance for the overall multi-level class-D power amplifier system.

FIG. 3 shows a schematic of an inductor-capacitor (LC) network contained in the single unit instance class-D power amplifier of FIG. 1 and the corresponding Smith chart illustrating impedance inversion at resonance for the overall multi-level class-D power amplifier system.

Z1 is the load impedance at the output terminal of the single unit instance class-D power amplifier 100. Z2 is the input impedance of single unit instance class-D power amplifier 100. FIG. 3 shows the relationship between Z1 and Z2 when the LC network is operating at resonance frequency. This impedance inversion relationship may be expressed as follows:

$$Z2 = B^2/Z1 \qquad Eq.\ (3)$$

where B is equal to $1/(wC)$.

FIG. 4A is an exemplary embodiment showing two single unit instance class-D power amplifiers coupled in a parallel configuration operating with both amplifier input signals ON and in-phase. For definitional purposes, the notion of parallel configuring multiple amplifiers in this way may also be referred to as "scaling". This operating situation is referred to as "Case #1", where both amplifier input signals are ON and in-phase. Input signal 1 and input signal 2 are both in-phase. Input signal 1 is coupled to an input terminal of unit instance 409. The input terminal of unit instance 409 is coupled to the input terminal of inverter 400. An output terminal of inverter 400 is coupled to a first terminal of capacitor 401. A second terminal of capacitor 401 is coupled to a first terminal of inductor 402. A second terminal of inductor 402 is coupled to signal ground. The second terminal of capacitor 401 is coupled to the first amplifier unit instance output 407. The unit instance output 407 is coupled to a first terminal of load resistor 403. A second terminal of load resistor 403 is coupled to signal ground. Input signal 2 is coupled to an input terminal of unit instance 410. The input terminal of unit instance 410 is couple to the input terminal of inverter 404. An output terminal of inverter 404 is coupled to a first terminal of capacitor 405. A second terminal of capacitor 405 is coupled to a first terminal of inductor 406. A second terminal of inductor 406 is coupled to signal ground. The second terminal of capacitor 405 is coupled to unit instance output terminal 408. Unit instance output 408 is coupled to the first terminal of load resistor 403.

The power loss of the first amplifier may be expressed as follows:

$$P_{LOSS1} \sim V_i^2 R_{on}/Z_i^2 \qquad Eq.\ (4)$$

where Vi is the input voltage, Ron is the on-resistance value and Zi is the input impedance of the LC network, which may be expressed as follows:

$$Z_i = B^2/(2R_L) \qquad Eq.\ (5)$$

where $B = 1/(wC)$ and $R_L$ is the load resistance.

The power loss of the second amplifier may be expressed as follows:

$$P_{LOSS1} \sim V_i^2 R_{on}/Z_i^2 \qquad Eq.\ (6)$$

where Vi is the input voltage, Ron is the on resistance value and Zi is the input impedance of the LC network, which may be expressed as follows:

$$Z_i = B^2/(2R_L) \qquad Eq.\ (7)$$

where $B = 1/(wC)$ and $R_L$ is the load resistance.

When the amplifiers in FIG. 4A are operating at resonant frequency the output power from each amplifier is combined without loss. When combining two in-phase signals the load impedance seen by each instance becomes twice as large, while the impedance seen at the drain becomes half as large due to impedance inversion. Therefore, efficiency decreases unless smaller Ron is used. Further, the power loss due to finite switch on-resistance reduces with output power. Thus, producing linear gain with close to constant efficiency which provides lossless amplitude modulation without the use of a direct-current (DC) to direct-current (DC) converter.

FIG. 4B is an exemplary embodiment showing two class-D amplifier circuits coupled in parallel configuration with a first amplifier input signal OFF and the second amplifier input signal ON. This operating situation is referred to as "Case #2", where the first amplifier input signal is OFF and the second amplifier input signal is ON. Input signal 1 is coupled to an input terminal of unit instance 409. The input terminal of unit instance 409 is coupled to the input terminal of inverter 400. An output terminal of inverter 400 is coupled to a first terminal of capacitor 401. A second terminal of capacitor 401 is coupled to a first terminal of inductor 402. A second terminal of inductor 402 is coupled to signal ground. The second terminal of capacitor 401 is coupled to the first amplifier unit instance output 407. The unit instance output 407 is coupled to a first terminal of load resistor 403. A second terminal of load resistor 403 is coupled to signal ground. Input signal 2 is coupled to an input terminal of unit instance 410. The input terminal of unit instance 410 is coupled to the input terminal of inverter 404. An output terminal of inverter 404 is coupled to a first terminal of capacitor 405. A second terminal of capacitor 405 is coupled to a first terminal of inductor 406. A second terminal of inductor 406 is coupled to signal ground. The second terminal of capacitor 405 is coupled to unit instance output terminal 408. Unit instance output 408 is coupled to the first terminal of load resistor 403.

The power loss of the first amplifier may be expressed as follows:

$$P_{LOSS3} \sim V_O^2/(B/R_{on}) = (R_L/B)^2 V_i^2/(B^2/R_{on}) \quad \text{Eq. (8)}$$

where Vi is the input voltage, Ron is the on-resistance value, $B=1/(wC)$ and $R_L$ is the load resistance.

The power loss of the second amplifier may be expressed as follows:

$$P_{LOSS1} \sim V_i^2 R_{on}/Z_i^2 \quad \text{Eq. (9)}$$

where Vi is the input voltage, Ron is the on resistance value and Zi is the input impedance of the LC network, which may be expressed as follows:

$$Z_i = B^2/R_L \quad \text{Eq. (10)}$$

where $B=1/(wC)$ and $R_L$ is the load resistance.

When the amplifiers of FIG. 4B are combining out of phase signals or not combing two signals, the impedance seen at the drain increases. Therefore, efficiency increases and signal amplitude drops. However, it is noted that the LC network may be tuned such that combining is loss-less only over narrow frequency bands. This may be done so that each instant presents high impedance only at narrow bands of frequencies, thus ensuring that one instance does not load other instances. This configuration may be very advantageous when utilizing a large number of class-D amplifiers coupled in parallel.

Figure 6:
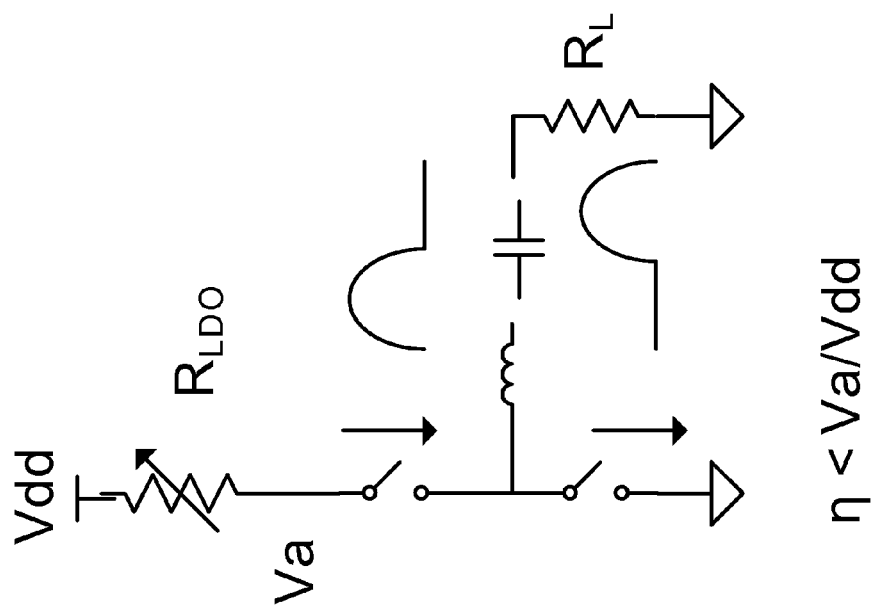
FIG. 6 shows a schematic diagram of a first conventional modulation scheme.
Figure 7:
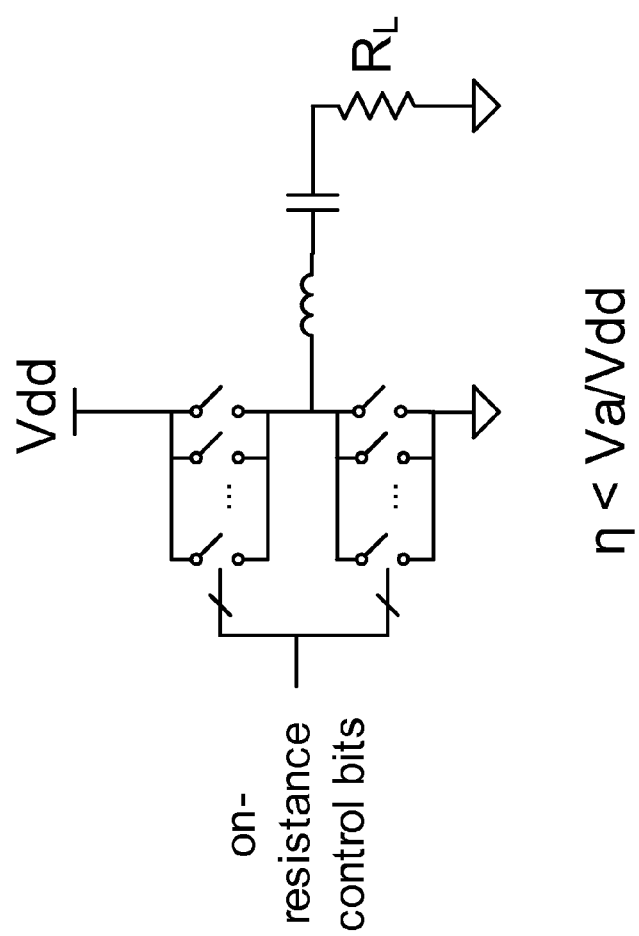
FIG. 7 shows a schematic diagram of second conventional modulation scheme.

The proposed multi-level class-D power amplifier scheme uses interpolation to directly reduce effective voltage source swing to achieve proportional reduction in switch loss with reduced signal power. Therefore, there is an advantage in power efficiency compared with supply modulation (polar modulation) based solutions shown in FIG. 6 and FIG. 7. Due to the loss-less power combination, power loss of the switch in each class-D element becomes proportional to delivered power, resulting in improved power efficiency at power back-off compared with polar modulation of switching-mode power amplifiers.

However, the use of large capacitors within the LC resonant circuitry introduces CV2 power loss. The CV2 power loss increases as the capacitance to inductance (C/L) ratio increases. This power loss is more than compensated for by the aforementioned increase in delivered power because while the CV2 power loss increases at 3 dB per doubling of the C/L ratio, the delivered power loss decreases at 6 dB per doubling of the C/L ration. Increasing the C/L ratio results in less percentage of power loss due to CV2 loss, and more due to switch loss which is proportional to delivered power. Finally the amplifier approaches constant efficiency over delivered power.

Figure 5:
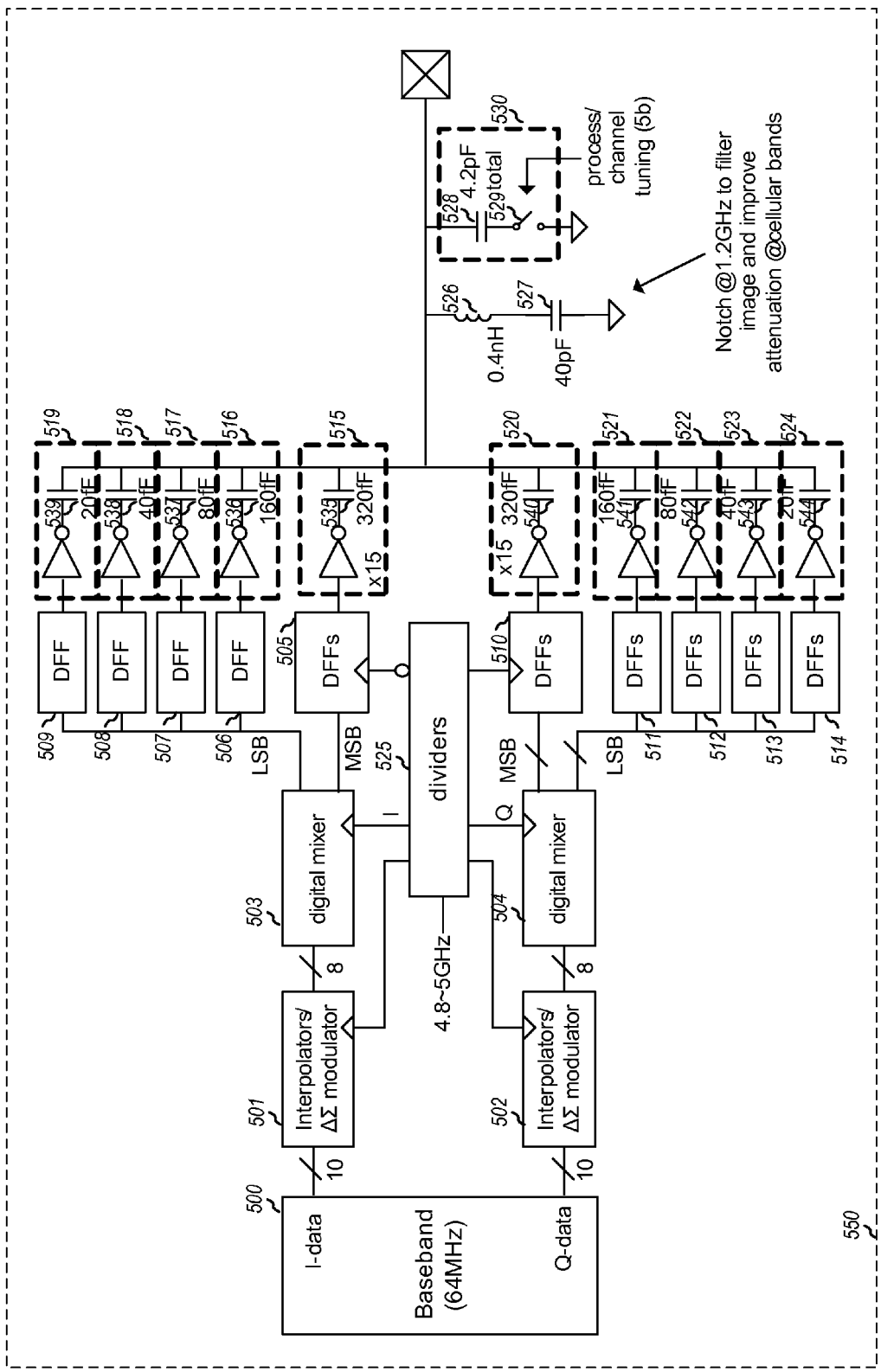
FIG. 5 is an exemplary embodiment of a digital IQ transmitter utilizing a multi-level class-D power amplifier system comprised of multiple ones of the single unit instance class-D power amplifiers shown in FIG. 1.

FIG. 5 is an exemplary embodiment of a digital IQ transmitter utilizing a multi-level class-D power amplifier system comprised of multiple ones of the single unit instance class-D power amplifiers shown in FIG. 1.

Baseband processor 500 generates in-phase (I) and quadrature (Q) data. The I and Q data is coupled to interpolators/sigma-delta modulators 501 and 502 respectively. An output of each interpolator/sigma-delta modulator 501 and 502 is coupled to an input of each digital mixer 503 and 504 respectively. Dividers 525 provide the clock signal for interpolators/sigma-delta modulators 501,502, digital mixers 503,504 and delay flip flops A most significant byte (MSB) output of each digital mixer 503 and 504 is coupled to delay flip flop (DFF) circuits 505 and 510, respectively. A least significant byte (LSB) output of each digital mixer 503 and 504 is coupled to four different DFF circuits 506-509 and 511-514, respectively. An output of DFF 505 is coupled to fifteen unit instances 515 coupled in parallel, each consisting of an inverter coupled to a capacitor in a series configuration. An output of DFF 510 is coupled to fifteen unit instances 520 coupled in parallel, each consisting of an inverter coupled to a capacitor in a series configuration. An output of each LSB DFF circuit 506-509 and 511-514 is in turn coupled to a single unit instance consisting of an inverter coupled to a capacitor in a series configuration. Outputs of all unit instances are coupled to a first terminal of inductor 526. A second terminal of inductor 526 is coupled to a first terminal of capacitor 527. A second terminal of capacitor 527 is coupled to signal ground. The first terminal of inductor 526 is coupled to a first terminal of capacitor 528. A second terminal of capacitor 528 is coupled to signal ground.

The fifteen unit instances 515, 520 for each MSB provide a reduction in power loss at the resonant frequency, thus improving efficiency. Secondly, increasing the number of elements utilized in the class-D amplifier allows reduction in quantization noise, which provides the desired improved out-of-band emission performance. Improved out-of-band emission performance allows for compliance with co-existence emission specifications without utilizing external filters. The elimination of external filters reduces the build of materials costs and device size.

The unit instances for each I and Q LSB combine without loss. For example, the LSB clocked by DFF 506 is coupled to a unit instance tuned to the same resonant frequency the unit instance coupled to DFF 511. Therefore, further improving efficiency and reducing quantization noise. Capacitor 527 and inductor 526 create a notch filter at 1.2 GHz to filter out the image signal as well as improve attenuation at cellular band frequencies. A process tuning circuit 530 is coupled to the first terminal of inductor 526. The process tuning circuit includes capacitor 528 in series combination with switch 529. Process tuning circuit 530 is when the process has a large capacitance variation.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A device comprising:
    a first power amplifier coupled to a first input to receive an initial set of bits from the multi bit pulse modulated signal; and
    a second power amplifier coupled to a second input and to the first power amplifier to receive the remaining set of bits from the multi bit pulse modulated signal, where the outputs of each of the first and second power amplifier resonate at a common frequency in a manner to reduce quantization noise.

2. The device of claim 1, where the power amplifiers are class-D power amplifiers.

3. The device of claim 2, where each class-D power amplifiers includes at least one element, where the totality of elements corresponds to a number that is equal or greater to the number of bits of the multi bit pulse modulated signal.

4. The device of claim 3, where each element receives only one bit and is sized proportionally to the weight of the bit.

5. The device of claim 4, where each class-D power amplifier includes at least a capacitor and an inductor.

6. The device of claim 5, where the capacitor is coupled in a series configuration.

7. The device of claim 6, where the inductor is coupled in a shunt configuration.

8. The device of claim 2, where the first and second inputs to each of the at least two class-D power amplifiers is a pulse width modulated signal.

9. The device of claim 2, where the input to each of the at least two class-D power amplifiers is a pulse density modulated signal.

10. The device of claim 1, further including a process tuning circuit coupled to the output of each power amplifier and comprised of a capacitor coupled in series with a switch.

11. A device comprising:
    a first group including a first set of power amplifiers coupled to a first input to receive an initial set of bits from the multi bit pulse modulated signal; and
    a second group including a second set of power amplifiers coupled to a second input to receive the remaining set of bits from the multi bit pulse modulated signal, where the first and second groups are coupled to one another, and where the outputs of each of the first and second sets of power amplifiers resonate at a common frequency in a manner to reduce quantization noise.

12. The device of claim 11, where the first and second set of power amplifiers are class-D power amplifiers.

13. The device of claim 12, where each class-D power amplifiers includes at least one element, where the number of elements is equal or greater to the number of bits of the multi bit pulse modulated signal.

14. The device of claim 13, where each element receives only one bit and is sized proportionally to the weight of the bit.

15. The device of claim 14, where each class-D power amplifiers includes at least a capacitor coupled in a series configuration.

16. The device of claim 14, where the output of each class-D power amplifier is coupled to a single inductor in a shunt configuration.

17. The device of claim 12, where the input to each class-D power amplifier is a pulse width modulated signal.

18. The device of claim 12, where the input to each class-D power amplifier is a pulse density modulated signal.

19. The device of claim 11, further including a process tuning circuit coupled to the output of each power amplifier and comprised of a capacitor coupled in series with a switch.

20. A multi-bit class-D power amplifier system for use in a wireless communication device, comprising:
   a first set of class-D power amplifiers to receive an initial set of bits from the multi bit pulse modulated signal; and
   a second set of class-D amplifiers coupled to the first set of class-D power amplifiers to receive the remaining set of bits from the multi bit pulse modulated signal, where outputs of each of the first and second set of class-D amplifiers resonate at a common frequency in a manner to reduce quantization noise.

21. The system of claim 20, where the totality of class D amplifiers corresponds to a number that is equal or greater to the number of bits of the multi bit pulse modulated signal.

22. The system of claim 21, where beach class-D power amplifiers includes a capacitor coupled in a series configuration.

23. The system of claim 21, where the output of each class-D power amplifier is coupled to a single inductor in a shunt configuration.

24. The system of claim 20, where the input to each class-D power amplifier is at least one of a pulse width modulated signal and a pulse density modulated signal.

25. The system of claim 20, further including a process tuning circuit coupled to the output of each class-D power amplifier and comprised of a capacitor coupled in series with a switch.

26. A device comprising:
   first means for amplifying an initial set of bits from the multi bit pulse modulated signal; and
   second means for amplifying the remaining set of bits from the multi bit pulse modulated signal, where outputs of each of the first and second means resonate at a common frequency in a manner to reduce quantization noise.

27. A multi-bit class-D power amplifier system for use in a wireless communication device, comprising:
   first means for amplifying an initial set of bits from the multi bit pulse modulated signal and including a first set of class-D power amplifiers; and
   second means for amplifying the remaining set of bits from the multi bit pulse modulated signal and including a second set of class-D power amplifiers, where outputs of each of the first and second set of class-D power amplifiers resonate at a common frequency in a manner to reduce quantization noise.

* * * * *